(12) United States Patent
Fu et al.

(10) Patent No.: US 7,506,438 B1
(45) Date of Patent: Mar. 24, 2009

(54) LOW PROFILE INTEGRATED MODULE INTERCONNECTS AND METHOD OF FABRICATION

(75) Inventors: Chia-Yu Fu, Chandler, AZ (US); Thomas A. Wetteroth, Chandler, AZ (US); Rong-Fong Huang, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 1756 days.

(21) Appl. No.: 09/712,749

(22) Filed: Nov. 14, 2000

(51) Int. Cl.
*H01K 3/10* (2006.01)

(52) U.S. Cl. .............. 29/852; 29/825; 29/846; 29/832; 174/259

(58) Field of Classification Search .......... 29/825, 29/830–834, 846–852; 174/255–259, 260–264; 428/138; 257/750, 787, E23.061; 361/764, 361/785; 427/97, 99
See application file for complete search history.

(56) References Cited

U.S. PATENT DOCUMENTS

| | | | |
|---|---|---|---|
| 3,606,677 A * | 9/1971 | Ryan | ................ 156/313 |
| 4,635,093 A | 1/1987 | Ross | |
| 4,790,894 A | 12/1988 | Homma et al. | |
| 5,235,496 A | 8/1993 | Chomette et al. | |
| 5,547,530 A * | 8/1996 | Nakamura et al. | ......... 156/247 |
| 5,600,101 A * | 2/1997 | Sakai | .......... 174/261 |
| 5,644,107 A * | 7/1997 | Kubota et al. | ............... 174/262 |
| 5,787,578 A * | 8/1998 | Farooq et al. | ................ 29/843 |
| 5,811,799 A | 9/1998 | Wu | |
| 6,249,962 B1* | 6/2001 | Bergstedt | ..................... 29/830 |
| 6,350,334 B1* | 2/2002 | Shigemi et al. | ............ 156/250 |

FOREIGN PATENT DOCUMENTS

| | | |
|---|---|---|
| EP | 0582881 A1 | 2/1994 |
| EP | 0933816 A2 | 8/1999 |
| EP | 0997941 A2 | 5/2000 |
| EP | 1050906 A1 | 11/2000 |
| JP | 63-233598 | 9/1988 |
| JP | 06-096992 | 4/1994 |
| JP | 10163591 | 9/2008 |
| TW | 389968 | 5/2000 |
| WO | WO 99/41957 | 8/1999 |
| WO | WO 00/19532 | 4/2000 |

\* cited by examiner

*Primary Examiner*—Minh Trinh

(57) ABSTRACT

A low profile integrated module is fabricated to include sheets of material, such as ceramic or PCB, fixed together and including a via extending through at least one of the plurality of sheets from the lower module surface partially to the upper module surface and in a side module surface. The via is filled with conductive material. The module is then mounted on a supporting substrate having a solder pad on the mounting surface with an area greater than the lower surface of the via. The lower surface of the via is positioned adjacent the upper surface of the mounting pad and soldered so that solder wicks up the via along the side module surface.

22 Claims, 4 Drawing Sheets

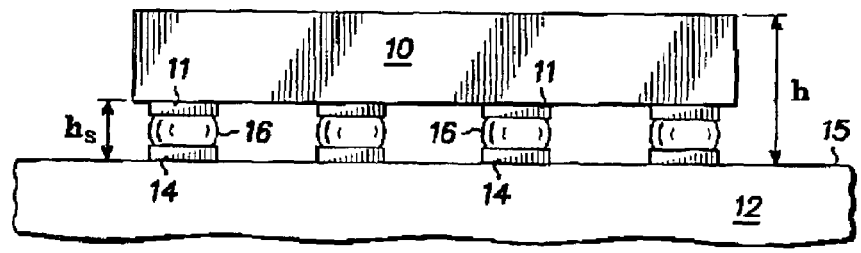
– PRIOR ART –    FIG. 1
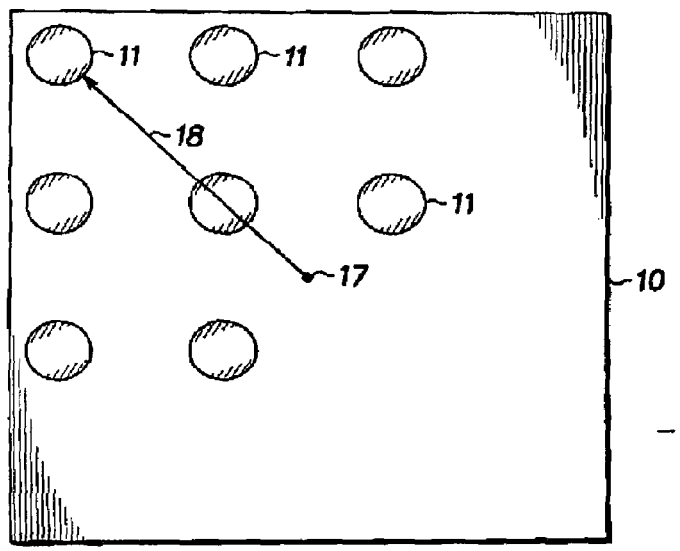
FIG. 2
– PRIOR ART –
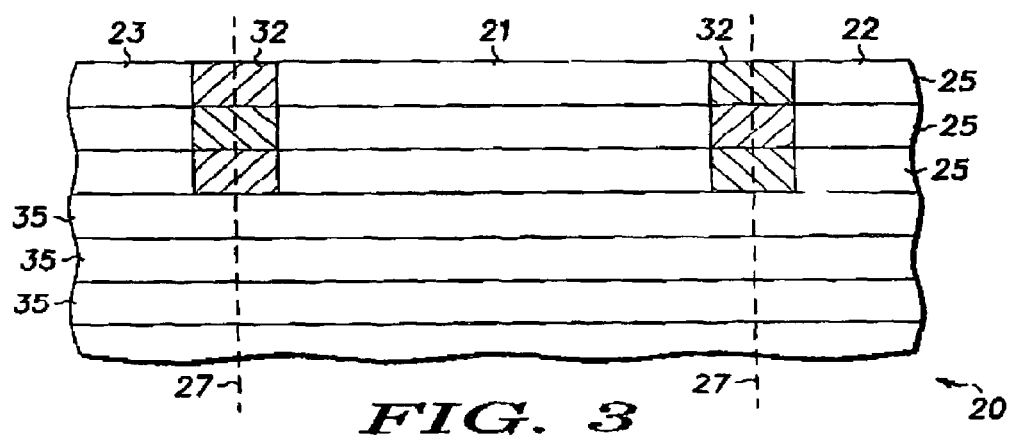
FIG. 3

US 7,506,438 B1

LOW PROFILE INTEGRATED MODULE INTERCONNECTS AND METHOD OF FABRICATION

FIELD OF THE INVENTION

This invention relates to apparatus and method for interconnecting integrated modules.

More particularly, the present invention relates to apparatus and method for interconnecting integrated modules with low profile interconnects having improved reliability.

BACKGROUND OF THE INVENTION

At the present time, many electronic circuits are integrated into small components or modules that are then mounted on larger carriers, such as printed circuit boards and the like. One of the major problems that arises in this process is the differences in thermal expansion between the material making up the integrated modules and the material making up the carriers. For example, a commonly employed material for integrated modules is ceramic. Ceramic integrated modules are generally mounted on some type of printed circuit board employing a hard plastic. The difference in thermal expansion in these materials produces a thermal expansion mismatch that can seriously effect the interconnect reliability and/or the life of the product.

Generally, the integrated modules have electrical traces distributed around the lower surface. In the prior art, the electrical traces of the integrated modules are electrically and physically connected to mounting and connecting pads on a printed circuit board by means of solder balls. The center of the module's lower surface can be considered as a zero stress or neutral point with connections spaced from the center having more stress, and the farther connections are spaced from the center the more stress they realize. Some of this stress is relieved by the solder balls, which provide a small amount of resiliency or movement. To further relieve this stress, the height of the solder ball is increased. The standoff height and the distance of the solder joint from the thermal expansion neutral point are well known to be the most critical factors responsible for solder joint thermal fatigue. Higher standoff heights and smaller distances from the thermal expansion neutral point are preferable.

Present demands for lower profile structures and larger integrated modules pose serious reliability issues. Generally, a customer specifies a maximum height (the distance between the surface of the mounting board and the upper surface of the module) that can be tolerated. The manufacturer must then arrange a compromise between the standoff height and the amount and position of the components in the module. Clearly, as the standoff height is increased to improve the interconnect thermal fatigue life, the number of components in the module must be reduced to achieve the specified maximum height.

Accordingly it would be highly desirable to provide apparatus and a method of reducing the standoff height and improving solder joint thermal fatigue life without reducing the reliability.

BRIEF DESCRIPTION OF THE DRAWINGS

Referring to the drawings:

FIG. 1 is a simplified side view of a prior art module, illustrating the mounting structure;

FIG. 2 is a simplified view in bottom plan of a prior art module, illustrating thermal expansion distances from the thermal expansion neutral point;

FIG. 3 is an enlarged sectional view of a portion of an assembly including a plurality of modules in accordance with the present invention;

DESCRIPTION OF THE PREFERRED EMBODIMENTS

Figure 4:
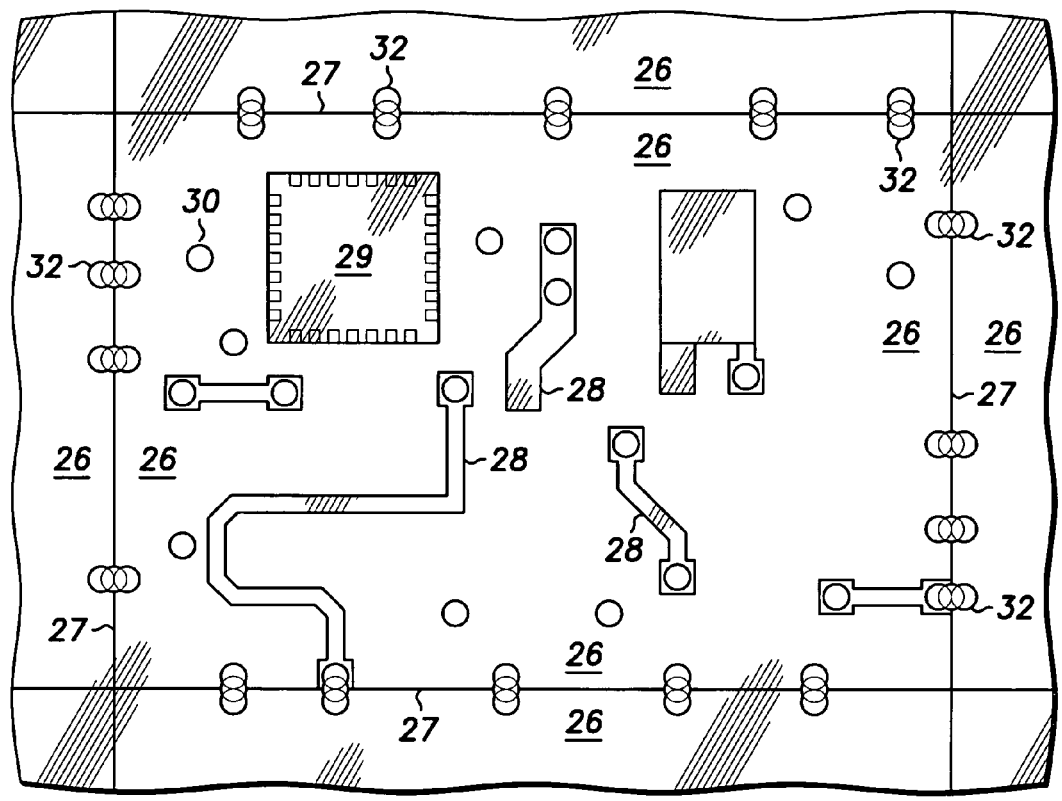
FIG. 4 is a greatly enlarged, detailed view of a portion of a single layer of the assembly of FIG. 3.
Figure 5:
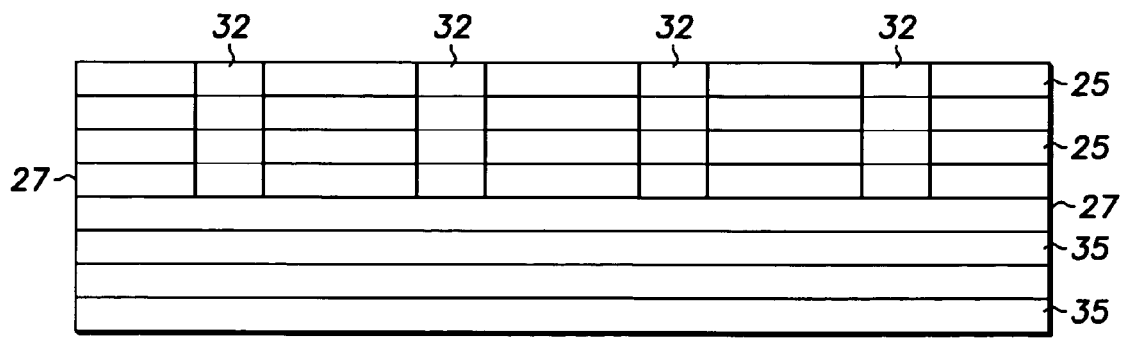
FIG. 5 is a simplified side view of a single module after being cut from adjacent modules in the assembly of FIG. 3.

Turning now to FIG. 1, a simplified side view of a prior art module 10 is illustrated. Module 10 includes a plurality of terminals 11 formed on the lower surface thereof. As is well known in the art, terminals 11 are connected internally to the circuits and components integrated within module 10. Terminals 11 also serve to mount module 10 on a supporting substrate 12. Supporting substrate 12 has a plurality of mounting/connecting pads 14 formed on the upper or mounting surface 15 and positioned to coincide with terminals 11 of module 10. Solder balls 16 are positioned between terminals 11 and mounting/connecting pads 14. During assembly, solder balls 16 are partially melted so as to physically and electrically adhere to terminals 11 and mounting/connecting pads 14. Thus, solder balls 16 physically mount module 10 on supporting substrate 12 and electrically connect terminals 11 to mounting/connecting pads 14.

Referring additionally to FIG. 2, a central point, designated 17, of the lower surface of module 10 is considered as a zero stress or neutral point with terminals 11 spaced from point 17 having increasing amounts of stress. The farther terminals 11 are spaced from point 17 the more stress they realize. In the example illustrated in FIG. 2, a terminal 11 situated in the corner of module 10 is spaced the farthest from point 17 and experiences the most stress, indicated by an arrow 18. Some of this stress is relieved by solder balls 16 (see FIG. 1), which provide a small amount of resiliency or movement. To improve the stress relieving characteristics of solder balls 16, the standoff height (designated $h_s$ in FIG. 1) between the lower surface of module 10 and upper surface 15 of supporting substrate 12 is increased. The standoff height $h_s$ and the distance of the solder joint from thermal expansion neutral point 17 are well known to be the most critical factors responsible for SMT solder joint thermal fatigue.

Present demands from customers include fabricating products with lower profiles, designated h in FIG. 1. Also, integrated modules are becoming larger. Both the lower profiles and the larger modules pose serious reliability issues since they directly conflict with higher standoff heights and shorter distances from neutral point 17. When a customer specifies a maximum height h that can be tolerated, the manufacturer must compromise between standoff height $h_s$ and the amount and position of the components in the module. Clearly, as standoff height $h_s$ is increased to improve the solder joint thermal fatigue life, the number of components that can be included in module 10 must be reduced to achieve the specified maximum height h.

Turning now to FIG. 3, an enlarged sectional view is illustrated of a portion of an assembly or stack 20 including a plurality of modules 21, 22, and 23. Assembly 20 is illustrated to aid in describing a method of fabricating a low profile integrated module, in accordance with the present invention. Here it should be specifically understood that assembly 20 could include a wide variety of sheets of materials, such as ceramic materials, high density interconnect printed circuit boards (HDI/PCB), presently known as FR4, and substantially any material wherein electrical circuits and components are included in sheets and stacked to form a complete circuit or electrical component.

In this preferred embodiment, a plurality of sheets 25 of unfired or green ceramic material are provided for exemplary purposes. A typical example of one sheet 25 is illustrated in FIG. 4. Each sheet 25 includes a plurality of module components 26 defined by sides 27 and formed adjacent each other so as to share sides 27. Each component 26 includes some electrical traces (designated 28 in FIG. 4), and may further include some electrical components such as capacitors, inductors, resistors, semiconductor integrated circuits (such as an IC designated 29), etc. Each component 26 also includes vias extending therethrough, some of which (designated 30) are located intermediately between sides 27 and some of which (designated 32) are formed in an elongated configuration to extend across sides 27 into adjacent components 26.

Figure 6:
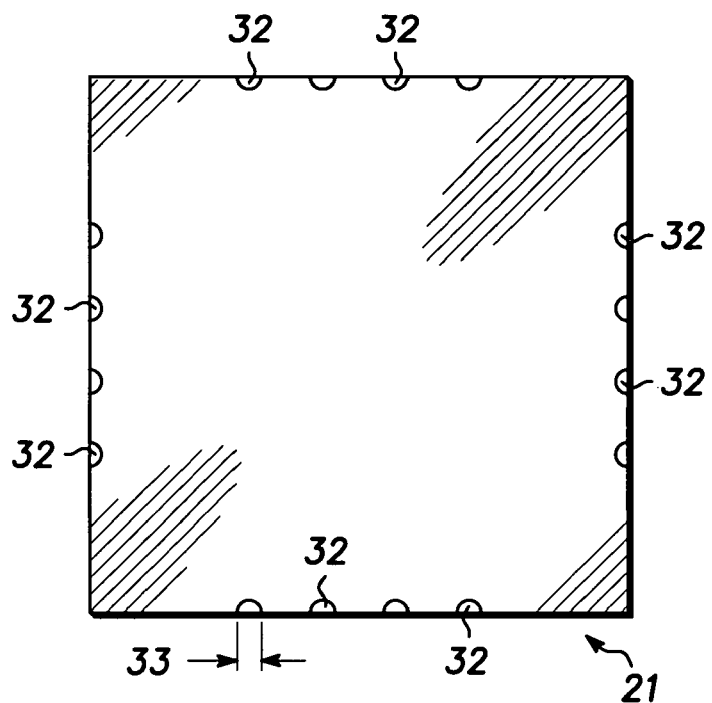
FIG. 6 is a simplified view in bottom plan of the module of FIG. 5.

In a preferred embodiment, vias 30 are formed, using punches, drills, lasers, etc. (hereinafter referred to as "punching"). Vias 32 are formed by punching a plurality of adjacent, partially overlapping, substantially round holes (referred to hereinafter as nibbling) to define a single via with an elongated cross-section. It will of course be understood that various sizes and shapes of vias can be formed, including but not limited to square, rectangular, round, oblong, etc., using, for example, nibbling and the round and elongated vias shown in FIGS. 4 and 6 are illustrated only to simplify an understanding of the fabrication process. As an example of the size of the various vias, the cross-sectional dimension of the exposed face of via 32, designated 33 in FIG. 6, is in a range of 125 μm to 500 μm.

As stated above, sheets 25 are formed of unfired or green ceramic material which, as is known in the art, usually includes $Al_2O_3$ particles, glass particles, and a binder, generally including organic material. After all of the vias 30 and 32 are properly formed in sheet 25, a metal paste, in this preferred embodiment an 80% silver and a solvent, is forced into the vias as, for example, by using a squeegee or the like. The solvent in the silver paste has a tendency to creep into the unfired ceramic material sides of the vias and firmly bind the silver paste in the vias. Here it will be understood that the metal paste can include any electrically conductive metal with a melting point generally greater than the firing temperature of the green ceramic sheets, i.e., generally greater than 800° C. It will further be understood that normal solders and the like can be used, if desired, in sheets of material which do not require high temperature curing or firing, such as the FR4 mentioned above.

Turning again to FIG. 3, it can be seen that a plurality of sheets 25 (in this example three) are stacked or positioned in overlying relationship with sides 27 and vias 32 vertically aligned to form common vias 32 and common sides 27 through the entire stack. It will of course be understood that internal vias 30 and various other connections are also aligned to provide one or more complete interconnected circuits.

Another plurality of sheets 35, formed of unfired or green ceramic material similar to sheets 25, are fabricated to include module components similar to module components 26 of sheets 25. Generally, the fabrication process for sheets 35 is similar to that described above for sheets 25, except that vias 32 are not included. Sheets 35 include some electrical traces, and may also include some electrical components such as capacitors, inductors, resistors, semiconductor integrated circuits, etc. Further, Sheets 35 include intermediate vias, similar to vias 30 in sheets 25, to provide interconnects between the various sheets 35 and 25. The plurality of sheets 35 (in this example three) are stacked or positioned in overlying relationship with the sides and any vias and components aligned to form one or more complete interconnected circuits.

As can be seen from FIG. 3, sheets 25 are stacked in overlying relationship over sheets 35 with sides 27 aligned so as to form a plurality of vertically aligned modules 21, 22, and 23. Modules 21, 22, and 23 are positioned in adjacent abutting relationship so as to share common sides 27 with the next adjacent module on each side. As is understood by those skilled in the art, sheets 25 and 35 are very thin and, generally, the total number of sheets used depends upon the circuit or circuits being integrated as well as any limitations on the height h specified by a user of the module (e.g., 2 mm). Further, the number of sheets 25 and the number of sheets 35 incorporated, depends upon a desired vertical length for the common vias 32. Practically, the number of sheets included in stack 20 could vary from a minimum of one sheet 25 and one sheet 35 to as many as twenty total sheets, or more. In this preferred embodiment, the number of sheets 25 and the number of sheets 35 in stack 20 is determined so that the common vias 32 extend vertically in a range from approximately 25 μm to approximately one half of the height of the stack (i.e., a distance between a lower surface of a lower sheet and an upper surface of an upper sheet).

It should be understood that, while a specific procedure for assembling stack 20 of sheets 25 and sheets 35 has been described in a way that enhances the understanding, any convenient assembly procedure may be followed. For example, it is generally expedient to form all of the required sheets 25 and 35 in advance and then stack them in the aligned position in one step. The exact sequence of steps described above and hereafter in achieving the stack of sheets is not critical to the invention and may be varied according to specific embodiments being fabricated.

Once stack 20 of unfired or green ceramic sheets has been assembled as illustrated in FIG. 3, the stack is cut or otherwise divided into individual modules. In this preferred embodiment stack 20 is cut with a very sharp instrument. The cutting is easily accomplished since sheets 25 and 35 are still formed of unfired or green ceramic. Stack 20 could be divided into individual modules after firing but fired ceramic is very hard and the process would be substantially more difficult. In FIG. 3, the sides 27 of adjacent modules 21 and 23 and adjacent modules 21 and 22 are indicated with broken lines. Here it should be noted that sides 27 extend through vias 32 so that upon cutting stack 20 along the broken lines each module 21, 22, and 23 has portions of vias 32 extending along the sides thereof, as illustrated in FIG. 6. Also, the cutting process is performed with sheets 25 at the top of the stack and sheets 35 at the bottom of the stack so that silver paste in vias 32 is held in place by the solid surface of sheets 35 during the cutting operation.

Once stack 20 is separated into individual modules (e.g. modules 21, 22, and 23), the modules are fired to cure the ceramic. As is understood in the art, the firing temperature is generally dictated by the composition of the green ceramic material. In this preferred embodiment, the green ceramic material includes $Al_2O_3$ particles, glass particles and an organic binder. In this case, the glass particles dictate the firing temperature, since the glass particles melt sufficiently to bind the aluminum particles together at a temperature of approximately 875° C. Also, at this temperature the organic binder is driven off to leave a ceramic comprising $Al_2O_3$ particles bound together by the at least partially melted and reformed glass. Also, the various sheets 25 and 35 are bound into a virtually single structure by the firing process. In the firing process the individual modules contract or shrink approximately 13%, but the shrinkage is substantially uniform so that it does not affect the final module. Further, during the firing process the silver paste in vias 30 and 32 is hardened firmly into position.

Figure 7:
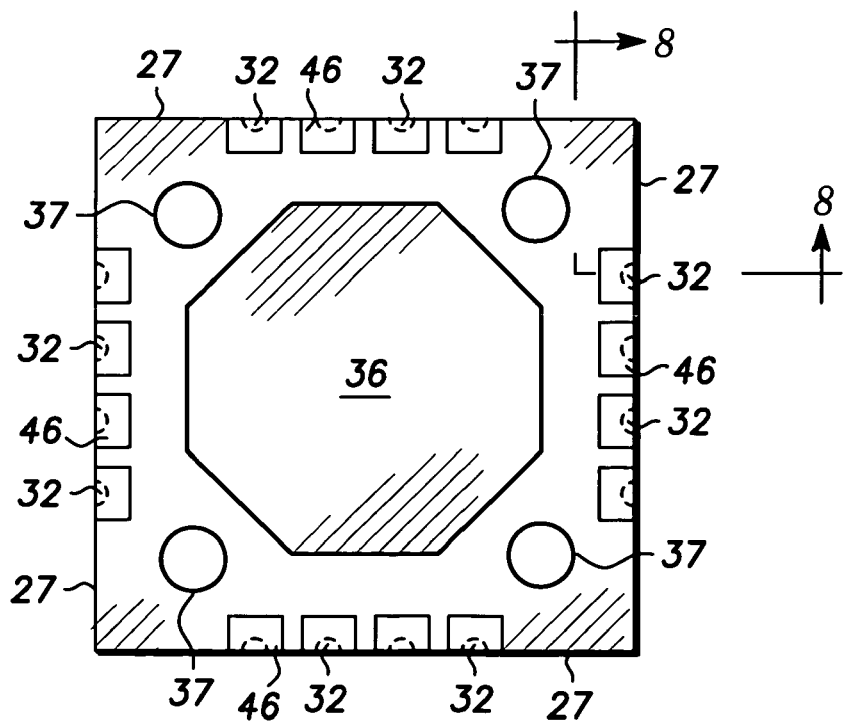
FIG. 7 is a view in bottom plan, similar to FIG. 6, of a module including a stress relief anchor pad.

Turning now to FIG. 7, a bottom view of another final module 21 is illustrated. A plurality of vias 32 are distributed along each side 27 and a stress relief anchor pad is positioned on the bottom surface. In this specific embodiment, the stress relief pad includes a centrally located octagonal element 36 and a round element 37 positioned in each corner. The stress relief pad is formed on the lower surface of the final sheet 25 (e.g., the top sheet in FIG. 3) and includes metal that is ultimately soldered to a supporting substrate (as will be described presently).

As explained briefly above, a central point of the lower surface of a module is considered as a zero stress or neutral point and the farther terminals are spaced from the neutral point the more stress they realize. In the embodiment illustrated in FIG. 7, the stress relief pad reduces stresses at adjacent interconnects or vias 32. Octagonal element 36 and round elements 37 are designed and positioned so that each via 32 is spaced approximately an equal and short distance therefrom. It will be understood that octagonal element 36 and round elements 37 could be formed as a single integrated stress relief pad if desired or they could be divided into additional elements, with the purpose being to provide equal and short distances between each via and the stress relief pad.

Figure 8:
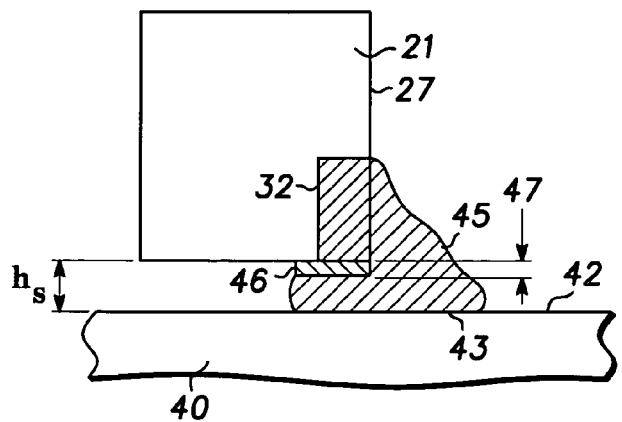
FIG. 8 is an enlarged sectional view of a single solder connection to a module in accordance with the present invention, taken along line 8-8 of FIG. 7.

The individual fired modules (e.g., module 21) can then be mounted on a supporting substrate 40, as illustrated in FIG. 8. In this preferred embodiment, supporting substrate 40 is a printed circuit board or the like with a mounting surface 42. Mounting pads 43 are fabricated on surface 42 using any well known process and a layer of reflowable solder or solder paste is applied using any well known technique, such as printing or the like. While only one mounting pad 43 is illustrated in FIG. 8, for convenience, it will be understood that any or all of vias 32, any vias 30, and/or any stress relief pad or pads, which it is desired to connect to supporting substrate 40, will generally have an aligned mounting pad 43 associated therewith.

Figure 9:
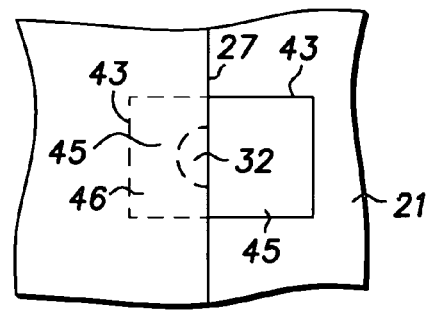
FIG. 9 is a top view of a portion of the module in accordance with FIG. 8.

Referring additionally to FIG. 9, it can be seen that mounting pads 43 are formed with a surface area that is larger than the lower adjoining surface area of the associated via 32. As an example, if via 32 id formed with a rectangular cross-sectional area having a maximum side dimension of approximately 125 μm, the surface area of mounting pad 43 may be generally rectangular with a length to width ratio of about 2:1. Solder (e.g., solder paste, etc.) is prepositioned on mounting pad 43, by solder printing or the like, to achieve a desired amount. The structure is then heated in a well known fashion to melt or reflow the solder paste or solder positioned on mounting pad 43. The prepositioned solder wicks-up the outside of via 32 to form a fillet 45, as illustrated in FIG. 8. The amount of prepositioned solder is selected so that the final standoff height a $h_s$ is preferably in a range of from 75 μm to 125 μm. This range allows the solder associated with the module to be printed at the same time as solder for other board elements or modules and the entire substrate 40 can be printed in one step.

Referring again to FIGS. 8 and 9, a connection and/or mounting pad 46 is provided on the lower surface of the lower sheet 25 of module 21 in contact with the lower surface of each via 32. Pad 46 has a surface area larger than the cross-sectional area of via 32 (see FIG. 8) so as to spread the stress over a larger area. The surface area of mounting pad 43 on supporting substrate 40 is then formed with a generally rectangular shape having a length to width ratio of about 2:1 and a surface area at least twice as large as the surface area of pad 46 (see FIG. 9).

Figure 10:
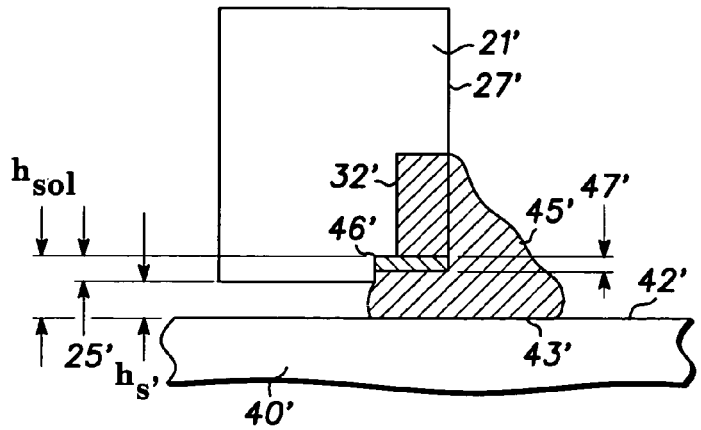
FIG. 10 is an enlarged sectional view of another single solder connection to a module in accordance with the present invention.
Figure 11:
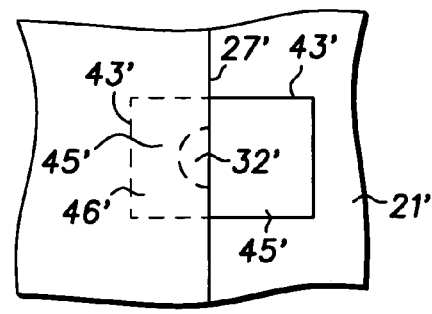
FIG. 11 is a top view of a portion of the module in accordance with FIG. 10.

Turning to FIGS. 10 and 11, another embodiment of apparatus for reducing stress is illustrated. In this embodiment, components similar to those illustrated in FIGS. 8 and 9 are designated with similar numbers and a prime is added to each number to indicate the different embodiment. In this embodiment, a connection and/or mounting pad 46' is provided on the lower surface of an interior sheet next to the lower sheet, with one or more lower sheets 25' having cutouts aligned with pad 46'. While only one mounting pad 43' is illustrated in FIGS. 10 and 11, for convenience, it will be understood that any or all of vias 32', any vias 30', and/or any stress relief pad or pads, which it is desired to connect to supporting substrate 40', will generally have an aligned mounting pad 43' associated therewith. In this embodiment, pad 46' is recessed into the lower surface of module 21' so that the total height of the solder, designated $h_{sol}$ in FIG. 10, is greater and, therefore, further reduces the stress on the joint. Depending upon the specific application and the number of vias required, pad 46' can be recessed one to several sheets of module 21' to increase the height $h_{sol}$. It should also be noted that by recessing pad 46', the standoff height $h_s$' of module 21' can be reduced to 25 μm or less if it is desired.

One additional problem that arises is the tendency of the silver to be scavenged or alloyed with any Sn based solder during the reflow (high temperature) process. Because of this scavenging or alloying, the integrity of solder interconnects becomes brittle and weakened. The effects of the scavenging or alloying of the silver can be overcome by providing a larger quantity of silver. For example, pad 46' can be formed of silver in a fashion similar to that described for the filling of the vias. In some specific applications, the cutout or cutouts in the lower sheet or sheets 25' of module 21' can be filled with silver in a fashion similar to that described for the filling of the vias. This cutout enables a thickness increase from 47 to 47' which will provide the additional silver to ensure strong interconnections.

Thus, vias 32 positioned in sides 27 of module 21 are constructed to extend only partially up the sides so as to improve the fabrication process. By extending vias 32 only partially up sides 27, the internal circuitry can be easily connected through internal electrical traces 28 and vias 30. The assembled or stacked unfired ceramic sheets of integrated circuitry are separated or cut while in the green state to greatly simplify the separation process. Further, by extending vias 32 only partially up sides 27, sheets 35 form a base for the silver or conductive metal in vias 32 so that they can be easily bisected without driving the silver or conductive metal out.

The fired and otherwise completed integrated modules are mounted on a supporting substrate with a greatly reduced standoff height $h_s$' (e.g., 75 μm to 125 μm versus a 375 μm ball in the prior art). Because of the conductive metal filled vias positioned along the edge and the size of the mounting pads on the supporting substrate, the solder used in the mounting and connecting process wicks-up the side of the module to form a fillet, which greatly strengthens the connection/mount and substantially increases reliability and life of the solder joint.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating a low profile integrated module comprising the steps of:
    providing a first sheet of material defining two adjacent integrated module first components, and forming a via extending through the first sheet between the two adjacent integrated module first components;
    wherein the step of forming the via includes forming a plurality of spaced apart vias and further including a step of providing a stress relief anchor pad spaced approximately an equal distance from each of the plurality of spaced apart vias;
    filling the via with a conductive metal;
    providing a second sheet of material defining two adjacent integrated module second components;
    providing a connection pad on a lower surface of the first sheet of material and contacting a lower surface of the portion of the via filled with conductive metal;
    fixing the first and second sheets in overlying relationship with the two adjacent integrated module first components aligned with the two adjacent integrated module second components to form two adjacent integrated modules; and
    cutting the first and second sheets, through the via to separate the first and second sheets into separate integrated modules, each module having a portion of the via filled with conductive metal in a periphery thereof and extending along a portion of the periphery.

2. A method of fabricating a low profile integrated module as claimed in claim 1 wherein the steps of providing the first sheet of material and providing the second sheet of material include providing sheets of printed circuit boards.

3. A method of fabricating a low profile integrated module as claimed in claim 2 wherein the step of filling the via with the conductive metal includes filling the via with a solder paste.

4. A method of fabricating a low profile integrated module as claimed in claim 1 wherein the steps of providing the first sheet of material and providing the second sheet of material include providing sheets of unfired ceramic material.

5. A method of fabricating a low profile integrated module as claimed in claim 4 wherein the steps of providing sheets of unfired ceramic material include providing sheets of $Al_2O_3$, glass particles and a binder.

6. A method of fabricating a low profile integrated module as claimed in claim 5 further including a step of firing the unfired ceramic material subsequent to the cutting step at a firing temperature high enough to form ceramic modules.

7. A method of fabricating a low profile integrated module as claimed in claim 6 wherein the step of filling the via with the conductive metal includes using a conductive metal with a melting temperature greater than the firing temperature.

8. A method of fabricating a low profile integrated module as claimed in claim 1 wherein the step of providing the first sheet of material further includes providing a plurality of first sheets of material each including a via extending therethrough.

9. A method of fabricating a low profile integrated module as claimed in claim 8 wherein the step of providing the second sheet of material further includes providing a plurality of second sheets of material.

10. A method of fabricating a low profile integrated module as claimed in claim 8 wherein the step of fixing the first and second sheets in overlying relationship aligns vias in the plurality of first sheets to produce a common via extending partially through the two adjacent integrated modules from a lower surface of a lower sheet to an upper surface of an intermediate sheet.

11. A method of fabricating a low profile integrated module as claimed in claim 10 where, in the steps of providing the plurality of first sheets and providing the plurality of second sheets, the pluralities provided result in the common via extending in a range from approximately 75 μm to approximately one half of a distance between a lower surface of a lower sheet and an upper surface of an upper sheet.

12. A method of fabricating a low profile integrated module as claimed in claim 1 wherein the step of forming the via includes forming a hole with a cross-sectional dimension in a range of approximately 125 μm to approximately 500 μm.

13. A method of fabricating a low profile integrated module as claimed in claim 12 wherein the step of forming the hole further includes forming a plurality of adjacent, partially overlapping, holes to define a single via with an elongated cross-section.

14. A method of fabricating a low profile integrated module as claimed in claim 1 wherein the step of providing the connection pad includes providing a connection pad with a contact surface area substantially greater than a cross-sectional area of the portion of the via.

15. A method of fabricating a low profile integrated module comprising the steps of:
    providing a plurality of first sheets of unfired ceramic material each defining two adjacent integrated module first components, and forming a plurality of vias extending through the plurality of first sheets between the two adjacent integrated module first components;
    providing a stress relief anchor pad on an exposed surface of one of the plurality of first sheets of unfired ceramic material, the stress relief anchor pad being spaced approximately an equal distance from each of the plurality of vias;
    filling each of the plurality of vias with a conductive metal paste;
    providing a plurality of second sheets of unfired ceramic material each defining two adjacent integrated module second components;
    providing a connection pad on a lower surface of a lowermost sheet of the plurality of first sheets of unfired ceramic material and contacting the lower surface of the portion of the via filled with conductive metal;
    fixing the plurality of first sheets and the plurality of second sheets in overlying relationship with the two adjacent integrated module first components aligned with the two adjacent integrated module second components to form two adjacent integrated modules;
    cutting the fixed pluralities of first and second sheets, through the pluralities of vias to separate the fixed pluralities of first and second sheets into two separate integrated modules, each module having a portion of each of the plurality of vias in a periphery thereof and extending along a portion of the periphery; and firing the two separate integrated modules at a firing temperature high enough to form ceramic modules, the conductive metal having a melting temperature greater than the firing temperature.

16. A method of fabricating a low profile integrated module as claimed in claim 15 wherein the step of providing the plurality of first sheets of unfired ceramic material further includes providing one of the plurality of first sheets of unfired ceramic material with an enlarged opening in communication with one of the plurality of vias.

17. A method of fabricating a low profile integrated module as claimed in claim 15 wherein the step of providing one of the plurality of first sheets of unfired ceramic material with an enlarged opening includes a step of at least partially filling the enlarged opening with the conductive metal paste thereby forming the connection pad in contact with the lower surface of the portion of the via filled with conductive metal in the periphery.

18. A method of fabricating a low profile integrated module as claimed in claim 15 wherein the step of fixing the pluralities of first and second sheets of unfired ceramic material in overlying relationship aligns vias in the plurality of first sheets of unfired ceramic material to produce a common via extending partially through the two adjacent integrated modules from a lower surface of a lower sheet of unfired ceramic material to an upper surface of an intermediate sheet of unfired ceramic material.

19. A method of fabricating a low profile integrated module as claimed in claim 18 where, in the steps of providing the plurality of first sheets of unfired ceramic material and providing the plurality of second sheets of unfired ceramic material, the pluralities provided result in the common via extending in a range from approximately 25 $\mu$m to approximately one half of a distance between a lower surface of a lower sheet of unfired ceramic material and an upper surface of an upper sheet of unfired ceramic material.

20. A method of fabricating a low profile integrated module as claimed in claim 15 wherein the step of forming the via includes forming a hole with a cross-sectional dimension in a range of approximately 125 $\mu$m to approximately 500 $\mu$m.

21. A method of fabricating a low profile integrated module as claimed in claim 20 wherein the step of forming the hole further includes forming a plurality of adjacent, partially overlapping holes to define a single via with an elongated cross-section.

22. A method of fabricating a low profile integrated module comprising the steps of:
providing a first sheet of material defining two adjacent integrated module first components, and forming a plurality of spaced apart vias extending through the first sheet between the two adjacent integrated module first components;
providing two stress relief anchor pads on a surface of the first sheet of material, one each of the two stress relief anchor pads being positioned within each of the two adjacent integrated module first components, and each of the two stress relief anchor pads being spaced approximately an equal distance from each of the plurality of vias;
filling the plurality of vias with a conductive metal;
providing a second sheet of material defining two adjacent integrated module second components;
fixing the first and second sheets in overlying relationship with the two adjacent integrated module first components aligned with the two adjacent integrated module second components to form two adjacent integrated modules, the second sheet of material being fixed to a surface of the first sheet of material opposite the surface of the first sheet of material having the two stress relief anchor pads thereon; and
cutting the first and second sheets, through the via to separate the first and second sheets into separate integrated modules, each module having one of the two stress relief anchor pads and a portion of each of the plurality of vias in a periphery thereof.

* * * * *